United States Patent [19]

Strangman et al.

[11] Patent Number: 5,015,502

[45] Date of Patent: May 14, 1991

[54] CERAMIC THERMAL BARRIER COATING WITH ALUMINA INTERLAYER

[75] Inventors: Thomas E. Strangman, Phoenix; Patricia A. Solfest, Chandler, both of Ariz.

[73] Assignee: Allied-Signal Inc., Phoenix, Ariz.

[21] Appl. No.: 433,886

[22] Filed: Nov. 8, 1989

Related U.S. Application Data

[62] Division of Ser. No. 266,972, Nov. 3, 1988, Pat. No. 4,880,614.

[51] Int. Cl.$^5$ ............................................. C23C 16/00
[52] U.S. Cl. ........................... 427/248.1; 427/42; 427/250; 427/328; 427/331; 427/405; 427/419.1; 427/419.2
[58] Field of Search ............... 427/42, 248.1, 250, 427/328, 331, 405, 419.1, 419.2

[56] References Cited

U.S. PATENT DOCUMENTS

| | | | |
|---|---|---|---|
| 3,542,530 | 11/1970 | Talboom, Jr. et al. | 428/667 |
| 3,676,085 | 7/1972 | Evans et al. | 420/588 |
| 3,754,903 | 8/1973 | Goward et al. | 420/443 |
| 3,928,026 | 12/1975 | Hecht et al. | 428/615 |
| 4,005,989 | 2/1977 | Preston | 428/651 |
| 4,055,705 | 10/1977 | Stecura et al. | 428/633 |
| 4,209,348 | 6/1980 | Duhl et al. | 148/3 |
| 4,255,495 | 3/1981 | Levine et al. | 428/678 |
| 4,321,310 | 3/1982 | Ulion et al. | 428/623 |
| 4,321,311 | 3/1982 | Strangman | 428/623 |
| 4,339,509 | 7/1982 | Dardi et al. | 428/632 |
| 4,401,697 | 8/1983 | Strangman | 427/248.1 |
| 4,405,659 | 9/1983 | Strangman | 427/248.1 |
| 4,405,660 | 9/1983 | Ulion et al. | 427/248.1 |
| 4,414,249 | 11/1983 | Ulion et al. | 427/248.1 |
| 4,576,874 | 3/1986 | Spengler et al. | 427/34 |
| 4,582,548 | 4/1986 | Harris et al. | 148/404 |
| 4,639,399 | 1/1987 | Aprigliano | 428/623 |
| 4,643,782 | 2/1987 | Harris et al. | 148/404 |
| 4,676,994 | 6/1987 | Demaray | 427/248.1 |
| 4,719,080 | 1/1988 | Duhl et al. | 420/443 |
| 4,743,514 | 5/1988 | Strangman . | |
| 4,861,618 | 8/1989 | Vine et al. | 427/34 |
| 4,900,640 | 2/1990 | Bell et al. | 428/633 |

*Primary Examiner*—Stanley Silverman
*Assistant Examiner*—Terry J. Owens
*Attorney, Agent, or Firm*—Robert A. Walsh; James W. McFarland

[57] ABSTRACT

A ceramic thermal barrier coating system for superalloy components subjected to high operating temperatures, such as gas turbine engine airfoils, includes a high purity alumina interfacial layer between the metallic substrate and the ceramic overcoat in order to better resist failure by spalling.

6 Claims, 1 Drawing Sheet

CERAMIC THERMAL BARRIER COATING WITH ALUMINA INTERLAYER

This invention was made with U.S. Government support under contract number F33615-85-C-5155 awarded by the U.S. Department of the Air Force, Wright Aeronautical Laboratories. The U.S. Government has certain rights in this invention.

This is a division of application Ser. No. 266,972 filed Nov. 3, 1988, now U.S. Pat. No. 4,880,614.

TECHNICAL FIELD

This invention relates generally to ceramic coating systems for metal substrates and more specifically to protective, multi-layer, ceramic thermal barrier coating systems for metallic components of gas turbine engines, such as superalloy blades and vanes.

BACKGROUND OF THE INVENTION

As is well known, the power and efficiency of gas turbine engines typically increases with increasing nominal operating temperature, but the ability of the turbine to operate at increasingly higher temperatures is limited by the ability of the turbine components, especially the vanes and blades, to withstand the heat, oxidation and corrosion effects of the impinging hot gas stream and still maintain sufficient mechanical strength. Thus, there exists a continuing need to find advanced material systems for use in components that will function satisfactorily in high performance gas turbines, which operate at higher temperatures and stresses.

One approach to providing improved turbine components is to fabricate a strong, stable substrate having the shape of the component, and cover the substrate with a thin protective coating that resists the oxidation and corrosion effects of the hot combustion gas stream. The underlying substrates, usually nickel-base or cobalt-base superalloy compositions, were at one time formed by common forging or simple casting procedures but now improved performance results from use of cooled airfoils made by directional solidification or directional recrystallization procedures. Even greater operating temperatures are possible by casting the substrate as a single crystal having no grain boundaries which might cause premature failure, and with the single crystal orientation selected to meet required creep-rupture and fatigue lives.

Insulative ceramic coatings further enhance turbine performance by reducing heat transferred into cooled airfoils, reducing the requirement for cooling air, which is a performance penalty. Durability of turbine components is also enhanced by ceramic coatings that minimize metal temperatures and thermal stresses in the superalloy component.

A modern ceramic coating system typically has several layers of differing compositions, and properties, in order to provide the best combination of benefits. For example, one layer may be relatively thick and porous to provide an insulative effect but, by itself, offering little resistance to oxidation, erosion, or corrosion. The outer surface of such a layer may be protected from erosion by providing a thin, hard, dense surface layer.

Generally, a thin metallic layer or bond coating is applied under the ceramic to protect the substrate through formation of an adherent oxide scale, such as aluminum oxide, which resists the oxidizing effects of the hot combustion gas stream. Other elements present in the coating contribute to the ability of the protective ceramic coating to adhere to the substrate through many cycles of gas turbine startup and shut down.

Lives of ceramic coatings are limited at high temperatures due to excessive growth of the oxide scale on the bond coating and flaws which develop within the interfacial zone between the metallic bond coating and insulative ceramic layer. Thermally induced deterioration of the interfacial zone coupled with thermal, and ceramic-superalloy thermal expansion mismatch, stresses eventually lead to spalling of the insulative layer.

It should be apparent from the foregoing general discussion of the art, that further improvements, in both the effectiveness and useful life, of coating systems are required in order to survive the increasingly severe operating conditions in high performance gas turbine engines.

It is therefore an object of the present invention to provide a new and improved ceramic based coating system for use on gas turbine engine components.

Another object of this invention is to increase the cyclic oxidation life of ceramic coating on gas turbine airfoils.

A further object of this invention is to provide improved methods of applying ceramic coatings to metallic substrates.

SUMMARY OF THE INVENTION

The present invention aims to improve upon the prior art by providing a novel ceramic-based, thermal barrier coating system for superalloy turbine components such as blades and vanes. The coating includes several layers which act synergistically to provide a significant increase in the cyclic oxidation life of the component. Basically, the layers include: a metallic bond or barrier coating, such as MCrAlY, an interfacial layer containing high purity alpha alumina, and an insulative overcoat such as a columnar grained, yttria stabilized zirconia ceramic outer layer. The preferred method of applying the bond coating and ceramic coating is by means of an electron-beam, physical vapor deposition process. Coatings may also be deposited by other physical vapor deposition processes, such as sputtering. However, the alumina interfacial layer should be applied by a chemical vapor deposition (CVD) process.

This new coating system provides about four times the life of prior art EB-PVD applied thermal barrier coatings when exposed to thermal cycling in burner rig testing. While the inventors do not wish to be held to any particular theory, it is believed that the relative absence of impurity oxides in the CVD alumina may contribute to slower alumina scale growth in service. In contrast to thermally grown oxide scales, which can contain submicron porosity, CVD alumina scales are expected to be essentially free of porosity. Consequently, CVD alumina scales may contribute to reduced oxidation, increased interfacial toughness, and retention of toughness after an extended period of high temperature service.

BRIEF DESCRIPTION OF THE DRAWINGS

While this specification concludes with claims particularly pointing out and distinctly claiming the subject matter which is regarded as the invention, it is believed that the objects, features, and advantages thereof may be better understood from the following detailed description of a presently preferred embodiment when taken in connection with the accompanying drawings in which:

BEST MODE FOR CARRYING OUT THE INVENTION

Figure 1:
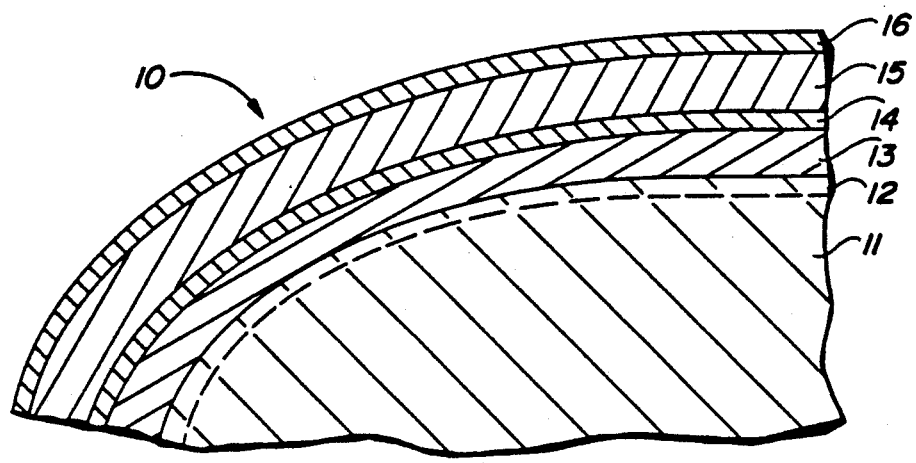
FIG. 1 is an enlarged fragmented sectional view through a turbine component illustrating the several layers of the present coating system.

Referring to FIG. 1, a turbine component (10), such as blade or vane, is shown in partial cross-section to illustrate the various layers (12-16) which may be applied to the metallic substrate (11).

The metallic substrate (11) is generally one of the nickel or cobalt base superalloys well known in the art. The examples discussed later used MAR-M247 alloy (which has a nominal composition of: 10% Co, 8.4% Cr, 0.65% Mo, 10% W, 3.3% Ta, 1.05% Ti, 5.5% Al, 1.4% Hf and minor amounts of Zr, C, and B in a nickel matrix) because it is commercially available in both the equiaxed and directionally solidified conditions for turbine airfoils. The present invention is also applicable when used in conjunction with the latest alloys which form single crystal airfoils. Such alloys are discussed in more detail in U.S. Pat. Nos. 4,209,348; 4,582,548; 4,643,782; and 4,719,080 which are incorporated herein by reference.

In accordance with present practice, the superalloy substrate (11) which is to be protected by ceramic coatings (14-17) must include a metallic bond coating (13) therebetween in order to provide an effective protection system.

The metallic bond layer (13) is usually comprised of a MCrAlY alloy. Such alloys have a broad composition of 10 to 35% chromium, 5 to 15% aluminum, 0.01 to 1% yttrium (or hafnium, lanthanum), with M, being the balance, being selected from the group consisting of iron, cobalt, nickel and mixtures thereof. Minor amounts of other elements such as Ta or Si may also be present. Such alloys are known in the prior art for use alone as a protective coating and are described in various U.S. Patents including U.S. Pat. Nos. 3,542,530; 3,676,085; 3,754,903; 3,928,026; 4,005,989; 4,055,705; 4,339,509 and 4,743,514 which are incorporated herein by reference.

In the examples below, the bond coating (13) had a nominal composition of 23% Co, 18% Cr, 12% Al, and 0.3% Y with the balance nickel.

It is preferred that this MCrAlY layer be applied by electron beam vapor deposition. Such a deposition process in combination with peening and heat treating provides a dense adherent layer of relatively uniform thickness which is basically free from defects. While performance is approximately proportional to the thickness, generally 1-10 mils is suitable. Usually the MCrAlY surface is treated, by peening or polishing or the like, to have a smooth finish (less than 50 microinch roughness).

Other deposition processes may be employed for producing the MCrAlY layer including sputtering and low pressure plasma spraying, so long as they produce a thin, uniform thickness, high integrity coating of the desired composition.

The primary function of this MCrAlY layer is to provide a durable bond with the subsequently deposited CVD alumina layer (14). The MCrAlY layer provides a reservoir of aluminum to permit continued slow growth of the oxidation inhibiting alumina layer (14) which occur under high temperature operating conditions. An important second function of this alumina layer (14) is to provide a good bonding surface for the adjacent ceramic layer. Alumina scales are chemically compatible with both the MCrAlY bond coat (13) and the insulative zirconia layer (15).

Several approaches have been tried in order to extend the oxidation resistance and life of the MCrAlY coating layer (13). An early approach involved the addition of a diffusion aluminide interlayer (12) under the MCrAlY layer (13) within the outermost portion of the superalloy substrate (11). The diffusion aluminide coating provided additional aluminum for scale formation as discussed more fully in U.S. Pat. No. 4,005,989; 4,321,311; 4,401,697; and 4,405,659.

This invention also contemplates the optional use of a diffusion aluminide interlayer (12) which has good alumina scale adhesion on hafnium and/or zirconium containing superalloys, without the presence of an MCrAlY layer. Oxide adhesion may be promoted for coatings on superalloys which do not contain hafnium (or a similar element) by the use of more complex diffusion aluminide coatings containing additions of elements which promote oxide scale adhesion, such as Pt, Rh, Si, and Hf. Of course, such complex and expensive interlayers will only be used where necessary.

The diffusion aluminide interlayer (12) is usually applied by standard commercially available aluminide processes whereby aluminum is reacted at the substrate surface to form an aluminum intermetallic compound which provides a reservoir for the formation of an alumina oxidation resistant interlayer. Thus the aluminide interlayer (12) is predominately composed of aluminum intermetallic (e.g. NiAl, CoAl, and (Ni/Co)Al phases) formed by reacting aluminum vapor or aluminum-rich alloy powder with the substrate elements in the outer surface layers of the superalloy component. This layer is typically well bonded to the substrate. Aluminizing may be accomplished by one of several conventional prior art techniques, such as, the pack cementation process, spraying, chemical vapor deposition, electrophoresis, sputtering, and slurry sintering with an aluminum rich vapor and appropriate diffusion heat treatments. The aluminiding layer may be applied at a temperature from room temperature up to 2100° F. depending upon the particular aluminiding process employed. The aluminiding layer (12) is usually applied to a depth or thickness of about 1 to 5 mils.

Other beneficial elements can also be incorporated into diffusion aluminide coatings by a variety of processes. Beneficial elements include Pt, Si, Hf and oxide particles, such as alumina, yttria, hafnia, for enhancement of alumina scale adhesion, Cr and Mn for hot corrosion resistance, Rh, Ta and Cb for diffusional stability and/or oxidation resistance and Ni, Co for increasing ductility and/or incipient melting limits. These elements can be added to the surface of the component prior to aluminizing by a wide range of processes including electroplating, pack cementation, chemical vapor deposition, powder metal layer deposition, thermal spray or physical vapor deposition processes. Some methods of coating, such as slurry fusion, permit some or all of the beneficial coating elements, including the aluminum, to be added concurrently. Other processes, such as chemical vapor deposition and pack cementation, can be modified to concurrently apply elements such as Si and Cr with the aluminum. In addition, the diffusion aluminide coatings will contain all elements present with the surface layer of the substrate. In the specific case of platinum modified diffusion aluminide coating layers, the coating phases adjacent to the alumina scale will be platinum aluminide and/or nickel-platinum aluminide phases (on a Ni-base superalloy).

In the present invention, the high purity, dense, CVD alpha alumina layer (14) is deposited onto the clean MCrAlY surface. The initial thickness of the CVD alumina layer is preferably about one micron. It will subsequently grow very slowly in thickness when the component is exposed to turbine operating conditions.

The thermal barrier coating (15), which may be applied as the final coating layer is preferably a columnar grained ceramic (such as zirconia) which is applied to the underlying alumina film on the MCrAlY bond coat (or the intermediate aluminide coating) which is tightly bonded to the superalloy substrate. The columnar grains are oriented substantially perpendicular to the surface of the substrate with interstices, or at least porosity, between the individual columns extending from the surface of the thermal barrier coating down to or near (within a few microns) the alumina scale. Such a coating is highly effective in reducing the amount of heat transferred into the substrate.

The columnar grained structure of this type of thermal barrier coating minimizes any stresses associated with the difference in the coefficients of thermal expansion between the substrate and the thermal barrier coating which would otherwise cause a failure in a dense or continuous ceramic coating. When heated or cooled, the metallic substrate expands (or contracts) at a greater rate than the ceramic thermal barrier coating. Gaps between the ceramic columnar grains permit the grains to expand and contract without producing sufficient stress to induce spalling or cracking of the thermal barrier coating. This limits the stress at the interface between the substrate and the thermal barrier coating, thus reducing or preventing fractures in the ceramic coating.

The columnar grain thermal barrier coating (16) may be any of the conventional ceramic compositions used for this purpose. Currently the strain-tolerant zirconia coatings are believed to be particularly effective as thermal barrier coatings; however, other ceramic thermal barrier coatings are known. A preferred ceramic coating is zirconia stabilized with from 6% to 30%, and more preferably from 8% to 20%, yttria. These zirconia ceramic layers have a thermal conductivity that is about a factor of thirty lower than that of the typical nickel based superalloy substrate, such as MAR-M247. The zirconia may be stabilized with CaO, MgO, $CeO_2$ as well as $Y_2O_3$. Other ceramics which are believed to be useful as the columnar type coating materials include alumina, ceria, hafnia (yttria-stabilized), mullite, and zirconium silicate.

Naturally, the particular ceramic material selected for use as the columnar grain thermal barrier coating should be stable in the high temperature environment of a gas turbine engine and not be so heavy as to overstress rotating components. In addition, the outermost surface (16) of the ceramic may be densified (e.g. by laser glazing or electrical biasing) to improve resistance to erosion and molten salt deposits.

The ceramic layer (15) may be applied by any prior art technique which provides an open columnar microstructure, preferably the electron beam evaporation-physical vapor deposition process. The thickness of the ceramic layer may vary from 1 to 1000 microns but is typically in the 50 to 300 microns range for most thermal barrier applications.

The electron beam evaporation-physical vapor deposition process for applying the thermal barrier coating is a modification of the standard high-rate vapor deposition process for metallic coatings. Power to evaporate the ceramic coating material is provided by a high-energy electron beam gun focused onto a zirconia target. The zirconia vapor produced by evaporation of the zirconia target material condenses onto the turbine airfoil component to form the thermal barrier coating. Zirconia coating deposition rates are typically in the range of about 0.01 to 1.0 mil per minute. The parts to be coated are preheated in a load lock by either radiant or electron beam heat sources and/or heated in the coating chamber prior to exposure to the ceramic vapor. During coating, the component temperature is typically maintained in the 1500° to 2100° F. range. Since zirconia becomes somewhat oxygen deficient due to partial dissociation during evaporation in a vacuum, oxygen may also be bled into the yttria-stabilized zirconia vapor cloud to minimize any deviation from stoichiometry during coating.

Figure 2:
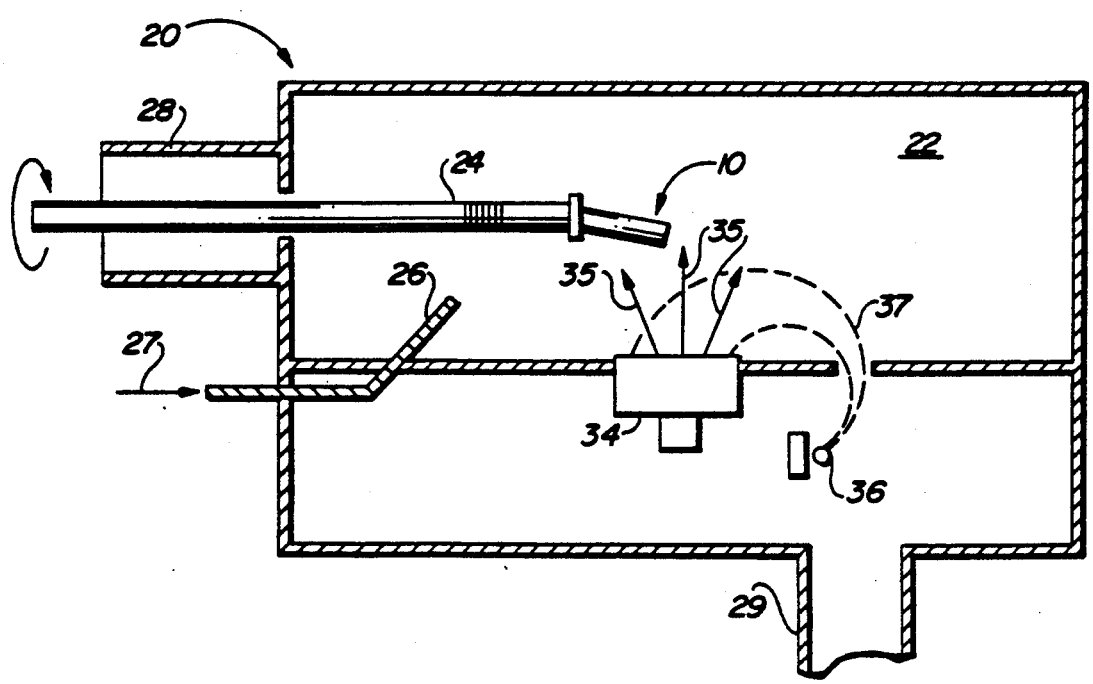
FIG. 2 is a schematic illustration of an apparatus suitable for carrying out the coating method of the present invention.

The method aspects of the present invention may be better understood by referring to FIG. 2 which schematically illustrates apparatus suitable for carrying out the invention.

The electron beam, physical vapor deposition (EB-PVD) apparatus (20) generally includes a vacuum chamber (22) surrounding the specimen to be coated (10), electron beam gun (36) and a target source (34) of material (e.g. zirconia) to be evaporated and subsequently condensed onto the specimen (10). In use, the chamber (22) is evacuated by vacuum pumps (not shown) connected at outlet (29) while a specimen (10) such as a turbine blade or vane is attached to a rotatable support rod (24) and inserted through airlock (28). The electron gun (36) is energized to supply a stream of hot electrons (37) to the surface of the zirconia source (34) which causes zirconia vapors (35) to be evaporated and subsequently condensed onto the rotating specimen (10). To insure that the deposited vapors are fully oxidized, an oxygen rich gas (27) is usually supplied into the chamber (22) through a bleed tube (26).

EXAMPLES

Burner rig testing was used to quantify the cyclic oxidation resistance and thermal strain tolerance of the coatings of the present invention as compared to a prior art baseline coating. The test cycle heated coated specimens to 1150° C. for 27 minutes in a hot exhaust stream from a mach 0.3 burner followed by 3 minutes of forced air cooling. Specimens were examined twice daily for evidence of ceramic spalling. The coating was considered to have failed when 0.5 square centimeter of ceramic had spalled from the hot zone of the specimen. Temperatures of the hot specimens were carefully controlled with an optical pyrometer and thermocouples.

The baseline coating consisted of a MAR.M247 superalloy substrate (11) with an EB-PVD NiCoCrAlY bond coating (13), having a thin, thermally grown interfacial aluminum oxide scale (14) on its surface, covered by a columnar grained, 8 to 20 percent yttria stabilized zirconia insulative layer (15).

While several process variables (not related to the present invention) were found to have a small effect on the coating life, the typical baseline coating life ranged from 15 to 35 hours until spallation in the above burner rig tests.

Coatings of the present invention, which were similar to the above baseline coating but contained a one micron thick, high purity, CVD alpha-alumina layer instead of a thermally grown scale between the bond coating and the yttria stabilized zirconia layer, had burner rig lives of 95 and 143 hours, a significant increase over the prior art coatings.

While in order to comply with the statute, this invention has been described in terms more or less specific to one preferred embodiment, it is expected that various alterations, modifications, or permutations thereof will be apparent to those skilled in the art. For example, the coating system disclosed herein may be used in other turbine components such as seals and shroud linings or many other metallic components subjected to high temperature environments.

Therefore, it should be understood that the invention is not to be limited to the specific features shown or described but it is intended that all equivalents be embraced within the spirit and scope of the invention as defined by the appended claims.

What is claimed is:

1. A method for producing a turbine component having an adherent ceramic thermal barrier coating on at least a portion of its surface, comprising the steps of:
   (a) providing a superalloy substrate with a clean surface,
   (b) applying a metallic bond coating onto at least a portion of said substrate surface,
   (c) depositing a high purity alpha alumina layer substantially free of other metallic oxides and porosity on said bond coating by a chemical vapor deposition process; and
   (d) applying a ceramic thermal barrier coating onto the alumina layer.

2. The method of claim 1 wherein said ceramic coating is applied by an electron beam, physical vapor deposition process.

3. The method of claim 2 wherein the ceramic coating is applied as a columnar grained coating containing zirconia.

4. The method of claim 3 further including the step of densifying the exterior surface of the ceramic coating.

5. The method of claim 1 wherein said metallic bond coating is applied by electron beam vapor deposition of a MCrAlY layer on said substrate.

6. The method of claim 5 wherein said MCrAlY layer is applied after aluminizing said substrate.

* * * * *